United States Patent [19]

Leatherman et al.

[11] Patent Number: 5,047,283

[45] Date of Patent: Sep. 10, 1991

[54] ELECTRICALLY CONDUCTIVE ARTICLE

[75] Inventors: Dennis D. Leatherman, Pittsburgh, Pa.; Kee V. Sin, Mira Mesa, Calif.; James A. Russell, Atlanta, Ga.

[73] Assignee: PPG Industries, Inc., Pittsburgh, Pa.

[21] Appl. No.: 409,853

[22] Filed: Sep. 20, 1989

[51] Int. Cl.$^5$ .............................................. B32B 9/00
[52] U.S. Cl. .................... 428/209; 428/137; 428/323; 428/331; 428/457; 428/688; 428/901; 264/104
[58] Field of Search ............... 428/137, 209, 323, 331, 428/457, 688, 901; 264/104; 361/397

[56] References Cited

U.S. PATENT DOCUMENTS

| | | | |
|---|---|---|---|
| 2,772,322 | 11/1956 | Witt et al. | 136/146 |
| 2,940,830 | 6/1960 | Thornhill | 23/182 |
| 3,351,495 | 11/1967 | Larson | 136/146 |
| 3,696,061 | 10/1972 | Selsor et al. | 260/2.5 M |
| 3,725,520 | 4/1973 | Suzuki et al. | 264/41 |
| 3,862,030 | 1/1975 | Goldberg | 210/24 |
| 3,903,234 | 9/1975 | Ikeda et al. | 264/210 R |
| 3,967,978 | 7/1976 | Honda et al. | 136/146 |
| 4,024,323 | 5/1977 | Versteegh | 429/249 |
| 4,102,746 | 7/1978 | Goldberg | 195/63 |
| 4,169,014 | 9/1979 | Goldberg | 435/182 |
| 4,210,709 | 7/1980 | Doi et al. | 429/250 |
| 4,226,926 | 10/1989 | Goldberg et al. | 429/252 |
| 4,237,083 | 12/1989 | Young et al. | 264/41 |
| 4,335,193 | 6/1982 | Doi et al. | 429/251 |
| 4,350,655 | 9/1982 | Hoge | 264/145 |
| 4,472,328 | 9/1984 | Sugimoto et al. | 264/41 |
| 4,585,604 | 4/1986 | Okuyama et al. | 264/41 |
| 4,597,828 | 7/1986 | Tadros | 427/96 |
| 4,613,643 | 9/1986 | Nakamura et al. | 524/426 |
| 4,648,417 | 3/1987 | Johnson et al. | 134/105 |
| 4,681,750 | 7/1987 | Johnson et al. | 423/339 |
| 4,734,229 | 3/1988 | Johnson et al. | 264/40.6 |
| 4,759,986 | 7/1988 | Marikar et al. | 428/394 |
| 4,791,144 | 12/1988 | Nagou et al. | 521/90 |
| 4,833,172 | 5/1989 | Schwarz et al. | 521/62 |
| 4,861,644 | 8/1989 | Young et al. | 428/195 |
| 4,868,008 | 9/1989 | Marikar et al. | 427/126.1 |

FOREIGN PATENT DOCUMENTS 2204270 11/1988 United Kingdom .

OTHER PUBLICATIONS

A. Stuart Wood, Molded 3-D Circuit Boards: Market Takeoff Coming in 1989; Modern Plastics, Dec. 1988; pp. 64-71.
A. Stuart Wood, Film and Design Developments Power a Buildup in Flexible Circuitry; Modern Plastics, Dec. 1988; pp. 73-75.
Frank Wood and Jim Templin, Allen-Bradley, Two New Processes Make Circuitry A Part of the Part; Research & Development, Jul. 1989; pp. 71, 72, 74.

Primary Examiner—Patrick J. Ryan
Attorney, Agent, or Firm—George D. Morris

[57] ABSTRACT

Microporous material comprising (1) a matrix consisting essentially of thermoplastic organic polymer, (2) a large proportion of finely divided water-insoluble siliceous filler, and (3) interconnecting pores is coated with electrically conductive coating and/or printed with electrically conductive printing ink. The resulting products have many uses as electrically conductive articles, including electromagnetic interference shields and printed circuit boards. Three-dimensional printed circuit boards are disclosed.

42 Claims, No Drawings

ELECTRICALLY CONDUCTIVE ARTICLE

The present invention is directed to microporous material coated or printed wholly or partially with electrically conductive coating or electrically conductive printing ink wherein the microporous material comprises a large proportion of siliceous particles.

Accordingly, one embodiment of the invention is an electrically conductive article comprising: (a) at least one sheet of microporous material having generally opposing sides, the microporous material on a coating-free, printing ink-free, and impregnant-free basis comprising: (1) a matrix consisting essentially of substantially water insoluble thermoplastic organic polymer, (2) finely divided substantially water-insoluble filler particles, of which at least about 50 percent by weight are siliceous particles, the filler particles being distributed throughout the matrix and constituting from about 50 to about 90 percent by weight of the microporous material (3) a network of interconnecting pores communicating substantially throughout the microporous material, the pores constituting at least about 35 percent by volume of the microporous material; and (b) electrically conductive coating or electrically conductive printing ink on at least a portion of at least one of the sides.

Another embodiment of the invention is a printed circuit comprising: (a) at least one sheet of microporous material having generally opposing sides, the microporous material on a coating-free, printing ink-free, and impregnant-free basis comprising: (1) a matrix consisting essentially of substantially water insoluble thermoplastic organic polymer, (2) finely divided substantially water-insoluble filler particles, of which at least about 50 percent by weight are siliceous particles, the filler particles being distributed throughout the matrix and constituting from about 50 to about 90 percent by weight of the microporous material, (3) a network of interconnecting pores communicating substantially throughout the microporous material, the pores constituting at least about 35 percent by volume of the microporous material; and (b) electrically conductive printing ink on at least a portion of at least one of the sides.

Yet another embodiment of the invention is a method for producing a three-dimensional printed circuit board comprising: (a) printing electrically conductive printing ink upon at least one side of a sheet of microporous material having generally opposing sides, the microporous material on a coating-free, printing ink-free, and impregnant-free basis comprising: (1) a matrix consisting essentially of substantially water insoluble thermoplastic organic polymer, (2) finely divided substantially water-insoluble filler particles, of which at least about 50 percent by weight are siliceous particles, the filler particles being distributed throughout the matrix and constituting from about 50 to about 90 percent by weight of the microporous material, (3) a network of interconnecting pores communicating substantially throughout the microporous material, the pores constituting at least about 35 percent by volume of the microporous material; (b) molding the printed microporous material with organic polymer to bond the printed microporous material to the organic polymer and to form the three-dimensional printed circuit board.

There are many advantages in using the microporous material described herein as a coating and/or printing substrate.

One such advantage is that the substrate need not be pretreated with any of the pretreatments customarily used to improve adhesion between the coating and/or printing ink and the thermoplastic organic polymer substrate such as flame treatment, chlorination, or especially corona discharge treatment which is most commonly employed. This is especially surprising in the case of polyolefins inasmuch as untreated polyolefins such as polyethylene and polypropylene cannot ordinarily be successfully printed because of a lack of adhesion between the polyolefin printing ink and the polyolefin substrate. The microporous material substrates used in the present invention may be pretreated to further improve coating-substrate adhesion and/or ink-substrate adhesion, but commercially satisfactory results can ordinarily be attained without employing such methods.

Another advantage is that the microporous material substrates accept a wide variety of coatings and printing inks, including most organic solvent-based coatings and inks which are incompatible with water, organic solvent-based coatings and inks which are compatible with water, and water-based coatings and inks.

Yet another advantage is very rapid drying of most printing inks to the tack-free stage upon printing the microporous material substrates. This advantage is quite important in high speed press runs, in multicolor printing, and in reducing or even eliminating blocking of stacks or coils of the printed substrate.

A further advantage is the sharpness of the printed image that can be attained. This is especially important in electronic circuit applications where fine lines and detailed drawings are to be printed.

Many known microporous materials may be employed in the present invention. Examples of such microporous materials are described in U.S. Pat. Nos. 2,772,322; 3,351,495; 3,696,061; 3,725,520; 3,862,030; 3,903,234; 3,967,978; 4,024,323; 4,102,746; 4,169,014; 4,210,709; 4,226,926; 4,237,083; 4,335,193; 4,350,655; 4,472,328; 4,585,604; 4,613,643; 4,681,750; 4,791,144; 4,833,172; and 4,861,644, the disclosures of which are, in their entireties, incorporated herein by reference.

The matrix of the microporous material consists essentially of substantially water-insoluble thermoplastic organic polymer. The numbers and kinds of such polymers suitable for use of the matrix are enormous. In general, substantially any substantially water-insoluble thermoplastic organic polymer which can be extruded, calendered, pressed, or rolled into film, sheet, strip, or web may be used. The polymer may be a single polymer or it may be a mixture of polymers. The polymers may be homopolymers, copolymers, random copolymers, block copolymers, graft copolymers, atactic polymers, isotactic polymers, syndiotactic polymers, linear polymers, or branched polymers. When mixture of polymers are used, the mixture may be homogeneous or it may comprise two or more polymeric phases. Examples of classes of suitable substantially water-insoluble thermoplastic organic polymers include the thermoplastic polyolefins, poly(halo-substituted olefins), polyesters, polyamides, polyurethanes, polyureas, poly(vinyl halides), poly(vinylidene halides), polyestyrenes, poly(vinyl esters), polycarbonates, polyethers, polysulfides, polyimides, polysilanes, polysiloxanes, polycaprolactones, polyacrylates, and polymethacrylates. Hybrid classes exemplified by the thermoplastic poly(urethane-ureas), poly(ester-amides), poly(silane-siloxanes), and poly(ether-esters) are within contemplation. Examples of suitable substantially water-insoluble thermoplastic organic polymers include thermoplastic high density polyethylene, low density polyethylene, ultrahigh molecular weight polyethylene, polypropylene (atactic, isotactic, or syndiotatic as the case may be), poly(vinyl chloride), polytetrafluoroethylene, copolymers of ethylene and acrylic acid, copolymers of ethylene and methacrylic acid, poly(vinylidene chloride), copolymers of vinylidene chloride and vinyl acetate, copolymers of vinylidene chloride and vinyl chloride, copolymers of ethylene and propylene, copolymers of ethylene and butene, poly(vinyl acetate), polystyrene, poly(omega-aminoundecanoic acid) poly(hexamethylene adipamide), poly(epsilon-caprolactam), and poly(methyl methacrylate). These listings are by no means exhaustive, but are intended for purposes of illustration. The preferred substantially water-insoluble thermoplastic organic polymers comprise poly(vinyl chloride), copolymers of vinyl chloride, or mixtures thereof; or they comprise essentially linear ultrahigh molecular weight polyolefin which is essentially linear ultrahigh molecular weight polyethylene having an intrinsic viscosity of at least about 18 deciliters/gram, essentially linear ultrahigh molecular weight polypropylene having an intrinsic viscosity of at least about 6 deciliters/gram, or a mixture thereof. Essentially linear ultrahigh molecular weight polyethylene having an intrinsic viscosity of at least about 18 deciliters/gram is especially preferred.

Inasmuch as ultrahigh molecular weight (UHMW) polyolefin is not a thermoset polymer having an infinite molecular weight, it is technically classified as a thermoplastic. However, because the molecules are essentially very long chains, UHMW polyolefin, and especially UHMW polyethylene, softens when heated but does not flow as a molten liquid in a normal thermoplastic manner. The very long chains and the peculiar properties they provide to UHMW polyolefin are believed to contribute in large measure to the desirable properties of microporous materials made using this polymer.

As indicated earlier, the intrinsic viscosity of the UHMW Polyethylene is at least about 18 deciliters/gram. In many cases the intrinsic viscosity is at least about 19 deciliters/gram. Although there is no particular restriction on the upper limit of the intrinsic viscosity, the intrinsic viscosity is frequently in the range of from about 18 to about 39 deciliters/gram. An intrinsic viscosity in the range of from about 18 to about 32 deciliters/gram is preferred.

Also as indicated earlier the intrinsic viscosity of the UHMW polypropylene is at least about 6 deciliters/gram. In many cases the intrinsic viscosity is at least about 7 deciliters/gram. Although there is no particular restriction on the upper limit of the intrinsic viscosity, the intrinsic viscosity is often in the range of from about 6 to about 18 deciliters/gram. An intrinsic viscosity in the range of from about 7 to about 16 deciliters/gram is preferred.

As used herein and in the claims, intrinsic viscosity is determined by extrapolating to zero concentration the reduced viscosities or the inherent viscosities of several dilute solutions of the UHMW polyolefin where the solvent is freshly distilled decahydronaphthalene to which 0.2 percent by weight, 3,5-di-tertbutyl-4-hydroxyhydrocinnasic acid, neopentanetetrayl ester [CAS Registry No. 6683-19-8] has been added. The reduced viscosities or the inherent viscosities of the UHMW polyolefin are ascertained from relative viscosities obtained at 135° C. using an Ubbelohde No. 1 viscometer in accordance with the general procedures of ASTM D 4020-81, except that several dilute solutions of differing concentration are employed. ASTM D 4020-81 is, in its entirety, incorporated herein by reference.

The nominal molecular weight of UHMW polyethylene is empirically related to the intrinsic viscosity of the polymer according to the equation:

$$M = 5.37 \times 10^4 \, [\eta]^{1.37}$$

where M is the nominal molecular weight and $[\eta]$ is the intrinsic viscosity of the UHMW polyethylene expressed in deciliters/gram. Similarly, the nominal molecular weight of UHMW polypropylene is empirically related to the intrinsic viscosity of the polymer according to the equation:

$$M = 8.88 \times 10^4 \, [\eta]^{1.25}$$

where M is the nominal molecular weight and $[\eta]$ is the intrinsic viscosity of the UHMW polypropylene expressed in deciliters/gram.

The essentially linear ultrahigh molecular weight polypropylene is most frequently essentially linear ultrahigh molecular weight isotactic polypropylene. Often the degree of isotacicity of such polymer is at least about 95 percent, while preferably it is at least about 98 percent.

When used, sufficient UHMW polyolefin should be present in the matrix to provide its properties to the microporous material. Other thermoplastic organic polymer may also be present in the matrix so long as its presence does not materially affect the properties of the microporous material in an adverse manner. The amount of the other thermoplastic polymer which may be present depends upon the nature of such polymer. In general, a greater amount of other thermoplastic organic polymer may be used if the molecular structure contains little branching, few long sidechains, and few bulky side groups, than when there is a large amount of branching, many long sidechains, or many bulky side groups. For this reason, the preferred thermoplastic organic polymers which may optionally be present are low density polyethylene, high density polyethylene, poly(tetrafluoroethylene), polypropylene, copolymers of ethylene and propylene, copolymers of ethylene and acrylic acid, and copolymers of ethylene and methacrylic acid. If desired, all or a portion of the carboxyl groups of carboxyl-containing copolymers may be neutralized with sodium, zinc, or the like. It is our experience that usually at least about 50 percent UHMW polyolefin, based on the weight of the matrix, will provide the desired properties to the microporous material. Often at least about 70 percent by weight of the matrix is UHMW polyolefin. In many cases the other thermoplastic organic polymer is substantially absent.

As present in the microporous material, the finely divided substantially water-insoluble siliceous particles may be in the form of ultimate particles, aggregates of ultimate particles, or a combination of both. In most cases, at least about 90 percent by weight of the siliceous particles used in preparing the microporous material have gross particle sizes in the range of from about 5 to about 40 micrometers as determined by use of a Model TAII Coulter counter (Coulter Electronics, Inc.) according to ASTM C 690-80 but modified by stirring the filler for 10 minutes in Isoton II electrolyte (Curtin Matheson Scientific, Inc.) using a four-blade, 4.445 centimeter diameter propeller stirrer. Preferably at least about 90 percent by weight of the siliceous particles have gross particle sizes in the range of from about 10 to about 30 micrometers. It is expected that the sizes of filler agglomerates may be reduced during processing of the ingredients to prepare the microporous material. Accordingly, the distribution of gross particle sizes in the microporous material may be smaller than in the raw siliceous filler itself. ASTM C 690-80 is, in its entirety, incorporated herein by reference.

Examples of suitable siliceous particles include particles of silica, mica, montmorillonite, kaolinite, asbestos, talc, diatomaceous earth, vermiculite, natural and synthetic zeolites, cement, calcium silicate, aluminum silicate, sodium aluminum silicate, aluminum polysilicate, alumina silica gels, and glass particles. Silica and the clays are the preferred siliceous particles. Of the silicas, precipitated silica, silica gel, or fumed silica is most often used.

In addition to the siliceous particles, finely divided substantially water-insoluble non-siliceous filler particles may also be employed. Examples of such optional non-siliceous filler particles include particles of titanium oxide, iron oxide, copper oxide, zinc oxide, antimony oxide, zirconia, magnesia, alumina, molybdenum disulfide, zinc sulfide, barium sulfate, strontium sulfate, calcium carbonate, magnesium carbonate, magnesium hydroxide, and finely divided substantially water-insoluble flame retardant filler particles such as particles of ethylenebis(tetra-bromophthalimide), octabromodiphenyl oxide, decabromodiphenyl oxide, and ethylenebisdibromonorbornane dicarboximide.

As present in the microporous material, the finely divided substantially water-insoluble non-siliceous filler particles may be in the form of ultimate particles, aggregates of ultimate particles, or a combination of both. In most cases, at least about 75 percent by weight of the non-siliceous filler particles used in preparing the microporous material have gross particle sizes in the range of from about 0.1 to about 40 micrometers as determined by use of a Micromeretics Sedigraph 5000-D (Micromeretics Instrument Corp.) in accordance with the accompanying operating manual. The preferred ranges vary from filler to filler. For example, it is preferred that at least about 75 percent by weight of antimony oxide particles be in the range of from about 0.1 to about 3 micrometers, whereas it is preferred that at least about 75 percent by weight of barium sulfate particles be in the range of from about 1 to about 25 micrometers. It is expected that the sizes of filler agglomerates may be reduced during processing of the ingredients to prepare the microporous material. Therefore, the distribution of gross particle sizes in the microporous material may be smaller than in the raw non-siliceous filler itself.

The particularly preferred finely divided substantially water-insoluble siliceous filler particles are precipitated silica. Although both are silicas, it is important to distinguish precipitated silica from silica gel inasmuch as these different materials have different properties. Reference in this regard is made to R. K. Iler, *The Chemistry of Silica*, John Wiley & Sons, New York (1979), Library of Congress Catalog No. QD 181.S6144, the entire disclosure of which is incorporate herein by reference. Note especially pages 15–29, 172–176, 218–233, 364–365, 462–465, 554–564, and 578–579. Silica gel is usually produced commercially at low pH by acidifying an aqueous solution of a soluble metal silicate, typically sodium silicate, with acid. The acid employed is generally a strong mineral acid such as sulfuric acid or hydrochloric acid although carbon dioxide is sometimes used. Inasmuch as there is essentially no difference in density between the gel phase and the surrounding liquid phase while the viscosity is low, the gel phase does not settle out, that is to say, it does not precipitate. Silica gel, then, may be described as a non-precipitated, coherent, rigid, three-dimensional network of contiguous particles of colloidal amorphous silica. The state of subdivision ranges from large, solid masses to submicroscopic particles, and the degree of hydration from almost anhydrous silica to soft gelatinous masses containing on the order of 100 parts of water per part of silica by weight, although the highly hydrated forms are only rarely used in the present invention.

Precipitated silica is usually produced commercially by combining an aqueous solution of a soluble metal silicate, ordinarily alkali metal silicate such as sodium silicate, and an acid so that colloidal particles will grow in weakly alkaline solution and be coagulated by the alkali metal ions of the resulting soluble alkali metal salt. Various acid may be used, including the mineral acids and carbon dioxide. In the absence of a coagulant, silica is not precipitated from solution at any pH. The coagulant used to effect precipitation may be the soluble alkali metal salt produced during formation of the colloidal silica particles, it may be added electrolyte such as a soluble inorganic or organic salt, or it may be a combination of both Precipitated silica, then, may be described as precipitated aggregates of ultimate particles of colloidal amorphous silica that have not at any point existed as macroscopic gel during the preparation. The sizes of the aggregates and the degree of hydration may vary widely.

Precipitated silica powders differ from silica gels that have been pulverized in ordinarily having a more open structure, that is, a higher specific pore volume. However, the specific surface area of precipitated silica as measured by the Brunauer, Emmet, Teller (BET) method using nitrogen as the adsorbate, is often lower than that of silica gel.

Many different precipitated silicas may be employed in the present invention, but the preferred precipitated silicas are those obtained by precipitation from an aqueous solution of sodium silicate using a suitable acid such as sulfuric acid, hydrochloric acid, or carbon dioxide. Such precipitated silicas are themselves known and processes for producing them are described in detail in U.S. Pat. No. 2,940,830, in U.S. Pat. No. 4,681,750, the entire disclosures of which are incorporated herein by reference, including especially the processes for making precipitated silicas and the properties of the products.

In the case of the preferred filler, precipitated silica, the average ultimate particle size (irrespective of whether or not the ultimate particles are agglomerated) is less than about 0.1 micrometer as determined by transmission electron microscopy. Often the average ultimate particle size is less than about 0.05 micrometer. Preferably the average ultimate particle size of the precipitated silica is less than about 0.03 micrometer.

The finely divided substantially water-insoluble filler particles constitute from about 50 to 90 percent by weight of the microporous material. Frequently such filler particles constitute from about 50 to about 85 percent by weight of the microporous material. From about 60 percent to about 80 percent by weight is preferred.

At least about 50 percent by weight of the finely divided substantially water-insoluble filler particles are finely divided substantially water-insoluble siliceous filler particles. In many cases at least about 65 percent by weight of the finely divided substantially water-insoluble filler particles are siliceous. Often at least about 75 percent by weight of the finely divided substantially water-insoluble filler particles are siliceous. Frequently at least about 85 percent by weight of the finely divided substantially water-insoluble filler particles are siliceous. In many instances all of the finely divided substantially water-insoluble filler particles are siliceous.

Minor amounts, usually less than about 5 percent by weight, of other materials used in processing such as lubricant, processing plasticizer, organic extraction liquid, surfactant, water, and the like, may optionally also be present. Yet other materials introduced for particular purposes may optionally be present in the microporous material in small amounts, usually less than about 15 percent by weight. Examples of such materials include antioxidants, ultraviolet light absorbers, reinforcing fibers such as chopped glass fiber strand, dyes, pigments, and the like. The balance of the microporous material, exclusive of filler and any coating, printing ink, or impregnant applied for one or more special purposes is essentially the thermoplastic organic polymer.

On a coating-free, printing ink free, impregnant-free, and pre-bonding basis, pores constitute at least about 35 percent by volume of the microporous material. In many instances the pores constitute at least about 60 percent by volume of the microporous material. Often the Pores constitute from at least about 35 percent to about 95 percent by volume of the microporous material. From about 60 percent to about 75 percent by volume is preferred. As used herein and in the claims, the Porosity (also known as void volume) of the microporous material, expressed as percent by volume, is determined according to the equation:

Porosity = $100[1 - d_1/d_2]$ where $d_1$ is the density of the sample which is determined from the sample weight and the sample volume as ascertained from measurements of the sample dimensions and $d_2$ is the density of the solid portion of the sample which is determined from the sample weight and the volume of the solid portion of the sample. The volume of the solid portion of the same is determined using a Quantachrome stereopycnometer (Quantachrome Corp.) in accordance with the accompanying operating manual.

The volume average diameter of the pores of the microporous material is determined by mercury porosimetry using an Autoscan mercury porosimeter (Quantachrome Corp.) in accordance with the accompanying operating manual. The volume average pore radius for a single scan is automatically determined by the porosimeter. In operating the porosimeter, a scan is made in the high pressure range (from about 138 kilopascals absolute to about 227 megapascals absolute). If about 2 percent or less of the total intruded volume occurs at the low end (from about 138 to about 250 kilopascals absolute) of the high pressure range, the volume average pore diameter is taken as twice the volume average Pore radius determined by the porosimeter. Otherwise, an additional scan is made in the low pressure range (from about 7 to about 165 kilopascals absolute) and the volume average pore diameter is calculated according to the equation:

$$d = 2\left(\frac{v_1 r_1}{w_1} + \frac{v_2 r_2}{w_2}\right)/\left(\frac{v_1}{w_1} + \frac{v_2}{w_2}\right)$$

where d is the volume average pore diameter, $v_1$ is the total volume of mercury intruded in the high pressure range, $v_2$ is the total volume of mercury intruded in the low pressure range, $r_1$ is the volume average pore radius determined from the high pressure scan, $r_2$ is the volume average pore radius determined from the low pressure scan, $w_1$ is the weight of the sample subjected to the high pressure scan, and $w_2$ is the weight of the sample subjected to the low pressure scan. Generally on a coating-free, printing ink-free, impregnant-free, and pre-bonding basis the volume average diameter of the pores is in the range of from about 0.02 to about 50 micrometers. Very often the volume average diameter of the pores is in the range of from about 0.04 to about 40 micrometers. From about 0.05 to about 30 micrometers is preferred.

In the course of determining the volume average pore diameter by the above procedure, the maximum pore radius detected is sometimes noted. This is taken from the low pressure range scan if run; otherwise it is taken from the high pressure range scan. The maximum pore diameter is twice the maximum pore radius.

Inasmuch as some coating processes, printing processes, impregnation processes and bonding processes result in filling at least some of the pores of the microporous material and since some of these processes irreversibly compress the microporous material, the parameters in respect of porosity, volume average diameter of the pores, and maximum pore diameter are determined for the microporous material prior to application of one or more of these processes.

Microporous material may be produced according to the general principles and procedures of U.S. Pat. Nos. 3,351,495; 4,833,172; and 4,861,644, the entire disclosures of which are incorporated herein by reference, including especially the processes for making microporous materials and the properties of the products.

Preferably filler particles, thermoplastic organic polymer powder, processing plasticizer and minor amounts of lubricant and antioxidant are mixed until a substantially uniform mixture is obtained. The weight ratio of filler to polymer powder employed in forming the mixture is essentially the same as that of the microporous material to be produced. The mixture, together with additional processing plasticizer, is introduced to the heated barrel of a screw extruder. Attached to the extruder is a sheeting die. A continuous sheet formed by the die is forwarded without drawing to a pair of heated calender rolls acting cooperatively to form continuous sheet of lesser thickness than the continuous sheet exiting from the die. The continuous sheet from the calender then passes to a first extraction zone where the processing plasticizer is substantially removed by extraction with an organic liquid which is a good solvent for the processing plasticizer, a poor solvent for the organic polymer, and more volatile than the processing plasticizer. Usually, but not necessarily, both the processing plasticizer and the organic extraction liquid are substantially immiscible with water. The continuous sheet then passes to a second extraction zone where the residual organic extraction liquid is substantially removed by steam and/or water. The continuous sheet is then passed through a forced air dryer for substantial removal of residual water and remaining residual organic extraction liquid. From the dryer the continuous sheet, which is microporous material, is passed to a take-up roll.

The processing plasticizer has little solvating effect on the thermoplastic organic polymer at 60° C., only a moderate solvating effect at elevated temperatures on the order of about 100° C., and a significant solvating effect at elevated temperatures on the order of about 200° C. It is a liquid at room temperature and usually it is processing oil such as paraffinic oil, naphthenic oil, or aromatic oil. Suitable processing oils include those meeting the requirements of ASTM D 2226-82, Types 103 and 104. Preferred are oils which have a pour point of less than 22° C. according to ASTM D 97-66 (reapproved 1978). Particularly preferred are include Shellflex ® 412 and Shellflex ® 371 oil (Shell Oil Co.) which are solvent refined and hydrotreated oils derived from naphthenic crude. Further examples of suitable oils include Arco Prime 400 oil (Atlantic Richfield Co.) and Kaydol ® oil (Witco Corp.) which are white mineral oils. ASTM D 2226-82 and ASTM D 97-66 (reapproved 1978) are, in their entireties, incorporated herein by reference. It is expected that other materials, including the phthalate ester plasticizers such as dibutyl phthalate, bis(2-ethylhexyl) phthalate, diisodecyl phthalate, dicyclohexyl phthalate, butyl benzyl phthalate, and ditridecyl phthalate will function satisfactorily as processing plasticizers.

There are many organic extraction liquids that can be used. Examples of suitable organic extraction liquids include 1,1,2-trichloroethylene, perchloroethylene, 1,2-dichloroethane, 1,1,1-trichloroethane, 1,1,2-trichloroethane, methylene chloride, chloroform, 1,1,2-trichloro-1,2,2-trifluoroethane, isopropyl alcohol, diethyl ether, and acetone.

In the above described process for producing microporous material, extrusion and calendering are facilitated when the substantially water-insoluble filler particles carry much of the processing plasticizer. The capacity of the filler particles to absorb and hold the processing plasticizer is a function of the surface area of the filler. It is therefore preferred that the filler have a high surface area. High surface area fillers are materials of very small particle size, materials having a high degree of porosity or materials exhibiting both characteristics. Usually the surface area of at least the siliceous filler particles is in the range of from about 20 to about 400 square meters per gram as determined by the Brunauer, Emmett, Teller (BET) method according to ASTM C 819-77 using nitrogen as the adsorbate but modified by outgassing the system and the sample for one hour at 130° C. Preferably the surface area is in the range of from about 25 to 350 square meters per gram. ASTM C 819-77 is, in its entirety, incorporated herein by reference. Preferably, but not necessarily, the surface area of any non-siliceous filler particles used is also in at least one of these ranges.

Inasmuch as it is desirable to essentially retain the filler in the microporous material, it is preferred that the substantially water-insoluble filler particles be substantially insoluble in the processing plasticizer and substantially insoluble in the organic extraction liquid when microporous material is produced by the above process.

The residual processing plasticizer content is usually less than 10 percent by weight of the microporous sheet and this may be reduced even further by additional extractions using the same or a different organic extraction liquid. Often the residual processing plasticizer content is less than 5 percent by weight of the microporous sheet and this may be reduced even further by additional extractions.

On a coating-free, printing ink free, impregnant-free, and pre-bonding basis, pores constitute from about 35 to about 80 percent by volume of the microporous material when made by the above-described process. In many cases the pores constitute from about 60 to about 75 percent by volume of the microporous material.

The volume average diameter of the pores of the microporous material when made by the above-described process, is usually in the range of from about 0.02 to about 0.5 micrometers on a coating-free, printing ink-free, impregnant-free, and pre-bonding basis. Frequently the average diameter of the pores is in the range of from about 0.04 to about 0.3 micrometers. From about 0.05 to about 0.25 micrometers is preferred.

Microporous material may also be produced according to the general principles and procedures of U.S. Pat. Nos. 2,772,322; 3,696,061; and/or 3,862,030, the entire disclosures of which are incorporated herein by reference, including especially the processes for making microporous materials and the properties of the products. These principles and procedures are particularly applicable where the polymer of the matrix is or is predominately poly(vinyl chloride) or a copolymer containing a large proportion of polymerized vinyl chloride.

The microporous material produced by the above-described processes may be used for producing electrically conductive articles of the present invention. However, many of them may optionally be stretched and the stretched microporous material used for producing such articles. When such stretching is employed, the products of the above-described processes may be regarded as intermediate products.

It will be appreciated that the stretching both increases the void volume of the material and induces regions of molecular orientation. As is well known in the art, many of the physical properties of molecularly oriented thermoplastic organic polymer, including tensile strength, tensile modulus, Young's modulus, and others, differ considerably from those of the corresponding thermoplastic organic polymer having little or no molecular orientation.

Stretched microporous material may be produced by stretching the intermediate product in at least one stretching direction above the elastic limit. Usually the stretch ratio is at least about 1.5. In many cases the stretch ratio is at least about 1.7. Preferably it is at least about 2. Frequently the stretch ratio is in the range of from about 1.5 to about 15. Often the stretch ratio is in the range of from about 1.7 to about 10. Preferably the stretch ratio is in the range of from about 2 to about 6. As used herein, the stretch ratio is determined by the formula:

$$S = L_2/L_1$$

where S is the stretch ratio, $L_1$ is the distance between two reference points located on the intermediate product and on a line parallel to the stretching direction, and $L_2$ is the distance between the same two reference points located on the stretched microporous material.

The temperatures at which stretching is accomplished may vary widely. Stretching may be accomplished at about ambient room temperature, but usually elevated temperatures are employed. The intermediate product may be heated by any of a wide variety of techniques prior to, during, and/or after stretching. Examples of these techniques include radiative heating such as that provided by electrically heated or gas fired infrared heaters, convective heating such as that provided by recirculating hot air, and conductive heating such as that provided by contact with heated rolls. The temperatures which are measured for temperature control purposes may vary according to the apparatus used and Personal preference. For example, temperature-measuring devices may be placed to ascertain the temperatures of the surfaces of infrared heaters, the interiors of infrared heaters, the air temperatures of points between the infrared heaters and the intermediate product, the temperatures of circulating hot air at points within the apparatus, the temperature of hot air entering or leaving the apparatus, the temperatures of the surfaces of rolls used in the stretching process, the temperature of heat transfer fluid entering or leaving such rolls, or film surface temperatures. In general, the temperature or temperatures are controlled such that the intermediate product is stretched about evenly so that the variations, if any, in film thickness of the stretched microporous material are within acceptable limits and so that the amount of stretched microporous material outside of those limits is acceptably low. It will be apparent that the temperatures used for control purposes may or may not be close to those of the intermediate product itself since they depend upon the nature of the apparatus used, the locations of the temperature-measuring devices, and the identities of the substances or objects whose temperatures are being measured.

In view of the locations of the heating devices and the line speeds usually employed during stretching, gradients of varying temperatures may or may not be present through the thickness of the intermediate product. Also because of such line speeds, it is impracticable to measure these temperature gradients. The presence of gradients of varying temperatures, when they occur, makes it unreasonable to refer to a singular film temperature. Accordingly, film surface temperatures, which can be measured, are best used for characterizing the thermal condition of the intermediate product. These are ordinarily about the same across the width of the intermediate product during stretching although they may be intentionally varied, as for example, to compensate for intermediate product having a wedge-shaped cross-section across the sheet. Film surface temperatures along the length of the sheet may be about the same or they may be different during stretching.

The film surface temperatures at which stretching is accomplished may vary widely, but in general they are such that the intermediate product is stretched about evenly, as explained above. In most cases, the film surface temperatures during stretching are in the range of from about 20° C. to about 220° C. Often such temperatures are in the range of from about 50° C. to about 200° C. From about 75° C. to about 180° C. is preferred.

Stretching may be accomplished in a single step or a plurality of steps as desired. For example, when the intermediate product is to be stretched in a single direction (uniaxial stretching), the stretching may be accomplished by a single stretching step or a sequence of stretching steps until the desired final stretch ratio is attained. Similarly, when the intermediate product is to be stretched in two directions (biaxial stretching), the stretching can be conducted by a single biaxial stretching step or a sequence of biaxial stretching steps until the desired final stretch ratios are attained. Biaxial stretching may also be accomplished by a sequence of one of more uniaxial stretching steps in one direction and one or more uniaxial stretching steps in another direction. Biaxial stretching steps where the intermediate product is stretched simultaneously in two directions and uniaxial stretching steps may be conducted in sequence in any order. Stretching in more than two directions is within contemplation. It may be seen that the various permutations of steps are quite numerous. Other steps, such as cooling, heating, sintering, annealing, reeling, unreeling, and the like, may optionally be included in the overall process as desired.

Various types of stretching apparatus are well known and may be used to accomplish stretching of the intermediate product. Uniaxial stretching is usually accomplished by stretching between two rollers wherein the second or downstream roller rotates at a greater peripheral speed than the first or upstream roller. Uniaxial stretching can also be accomplished on a standard tentering machine. Biaxial stretching may be accomplished by simultaneously stretching in two different directions on a tentering machine. More commonly, however, biaxial stretching is accomplished by first uniaxially stretching between two differentially rotating rollers as described above, followed by either uniaxially stretching in a different direction using a tenter machine or by biaxially stretching using a tenter machine. The most common type of biaxial stretching is where the two stretching directions are approximately at right angles to each other. In most cases where continuous sheet is being stretched, one stretching direction is at least approximately parallel to the long axis of the sheet (machine direction) and the other stretching direction is at least approximately perpendicular to the machine direction and is in the plane of the sheet (transverse direction).

After stretching has been accomplished, the microporous material may optionally be sintered, annealed, heat set and/or otherwise heat treated. During these optional steps, the stretched microporous material is usually held under tension so that it will not markedly shrink at the elevated temperatures employed, although some relaxation amounting to a small fraction of the maximum stretch ratio is frequently Permitted.

Following stretching and any heat treatments employed, tension is released from the stretched microporous material after the microporous material has been brought to a temperature at which, except for a small amount of elastic recovery amounting to a small fraction of the stretch ratio, it is essentially dimensionally stable in the absence of tension. Elastic recovery under these conditions usually does not amount to more than about 10 percent of the stretch ratio.

The stretched microporous material may then be further processed as desired. Examples of such further processing steps include reeling, cutting, stacking, treatment to remove residual processing plasticizer or extraction solvent, coating or impregnation with various materials, and fabrication into shapes for various end uses.

Stretching is preferably accomplished after substantial removal of the processing plasticizer as described above. For purposes of this invention, however, the calendered sheet may be stretched in at least one stretching direction followed by substantial removal of the residual organic extraction liquid. It will be appreciated that as stretching may be accomplished in a single step or a plurality of steps, so likewise extraction of the processing plasticizer may be accomplished in a single step or a plurality of steps and removal of the residual organic extraction liquid may be accomplished in a single step or a plurality of steps. The various combinations of the steps stretching, partial stretching, processing plasticizer extraction, partial plasticizer extraction, removal of organic extraction liquid, and partial removal of organic extraction liquid are very numerous, and may be accomplished in any order, provided of course, that a step of processing plasticizer extraction (partial or substantially complete) precedes the first step of residual organic extraction liquid removal (partial or substantially complete). It is expected that varying the orders and numbers of these steps will produce variations in a least some of the physical properties of the stretched microporous product.

In all cases, the porosity of the stretched microporous material is, unless coated, printed, or impregnated after stretching, greater than that of the intermediate product. On a coating-free, printing ink-free, and impregnant-free basis, pores usually constitute more than 80 percent by volume of the stretched microporous material. In many instances the pores constitute at least about 85 percent by volume of the stretched microporous material. Often the pores constitute from more than 80 percent to about 95 percent by volume of the stretched microporous material. From about 85 percent to about 95 percent by volume is preferred.

Generally the volume average diameter of the pores of the stretched microporous material is in the range of from 0.6 to about 50 micrometers. Very often the volume average diameter of the pores is in the range of from about 1 to about 40 micrometers. From about 2 to about 30 micrometers is preferred.

"Coating" and "printing" are by custom usually referred to separately, although they share many characteristics in common. In many applications, especially in the field of graphic arts, the differences become tenuous at best. Perhaps the distinction most often used is that "coating" is ordinarily thought of as involving application of the film-forming composition to relatively large areas of the substrate whereas "printing" is generally considered to involve application of the film-forming composition in finer detail to relatively small areas of the substrate. Nevertheless, application of film-forming composition to localized areas of the substrate is referred to sometimes as "coating" and at other times as "printing." Many processes used for coating may, with little or no modification, be used for printing, and vice versa. For purposes of the present specification and claims, the above-described distinction and general customs of the trade will be observed, although it should be recognized that in some situations the distinction will have more significance than in others.

Microporous material substrate, whether or not stretched, may be coated and/or printed with a wide variety of electrically conductive coating compositions and/or electrically conductive printing inks using a wide variety of coating and/or printing processes. The electrically conductive coating compositions, coating processes, electrically conductive printing inks, and printing processes are themselves conventional.

Examples of coating processes that can be used include brushing, spraying, roll coating, curtain coating, offset coating, powder coating, and the like.

One class of printing processes that can be used is typographic printing where ink is placed on macroscopically raised areas of the printing plate. Examples of typographic processes include letterpress printing, flexography, and letterset printing which is also known as dry offset printing and as offset letterpress printing.

Another class of printing suitable for use is intaglio printing, also known as gravure printing, where ink is placed on depressed areas of the printing plate.

Yet another class of printing processes suitable for use is planographic printing where ink is placed on localized regions of a printing plate that is either smooth or contains only microscopically raised areas. A subclass of particular interest is lithography, which includes several variations. Conventional lithography uses oil-based inks while reverse lithography uses water-based inks. In direct lithography (whether conventional or reverse), printing ink is applied to the substrate directly from the lithographic printing plate. In offset lithography (whether conventional or reverse), the printing ink is transferred first from the lithographic printing plate to a printing blanket and then from the printing blanket to the substrate. Other types of planographic printing include collotype printing, autotype printing, laser printing, and xerography.

Another class of printing processes that can be used is stencil printing, including screen printing.

Various miscellaneous printing processes that can be used including ink jet printing.

Of the printing processes, screen printing, lithography, and letterpress printing are most often used. Of the lithographic processes, offset lithography is preferred, especially when the lithography is conventional lithography.

The microporous substrate is suitable for line printing, halftone printing, and continuous tone printing. For electronic circuit boards, line printing is most often used.

Printing is usually accomplished using a screen printer or a printing press. The three general types of printing presses commonly used for printing flat substrates are the platen press, the flat-bed cylinder press, and the rotary press. The rotary press, which may be sheet fed or web fed, is the type of printing press most often used.

There are many differences in printing inks, some physical and some chemical. Consequently there is a wide variety of systems for classifying inks depending upon which similarities and differences it is desired to emphasize. Most inks used for printing are liquids or pastes, that is, the vehicle before drying contains a liquid. There are a few exceptions such as xerographic printing ink also known as toner, which is dry. Oil-based and most organic solvent based inks are not compatible with water, whereas water-based inks are not ordinarily compatible with oil. Inks usually dry by evaporation of liquid, by adsorption of liquid into the substrate, by crosslinking of the binder, by cooling or by a combination of two or more of these. Other systems of classification are based on the type of binder, such as rubber-based, drying oil based, non-drying oil based, natural resin-based, gilsonite-based, asphaltic-based, synthetic resin-based, and the like. Yet another classification system is based upon viscosity of the ink. Still another is based upon the types of colorant which may be present, such as pigment-based, toner-based, dye-based, pigment and dye based, clear, and the like. Other systems are based upon the printing processes employed for deposition of the ink on the substrate.

In keeping with customary usage, the term "printing ink" is used herein with reference to the ink composition employed in printing and with reference to the printed composition on the substrate, whether before drying or after drying, partial drying, or hardening. The correct usage will be obvious from the context or expressly stated.

Printing processes, printing equipment, and printing inks have been extensively discussed and documented. Examples of reference works that may be consulted include L. M. Larsen, *Industrial Printing Ink,* Reinhold Publishing Corp., (1962); Kirk-Othmer, *Encyclopedia of Chemical Technology,* 2d Ed., John Wiley & Sons, Inc., Vol. 11, pages 611-632 (1966) and Vol. 16, pages 494-546 (1968); and R. N. Blair, *The Lithographers Manual,* The Graphic Arts Technical Foundation, Inc., 7th Ed. (1983).

For a more detailed description of printing on certain types of microporous material that may be employed in the present invention, see U.S. Pat. No. 4,861,644, the entire disclosure of which is incorporated herein by reference.

As is the case in respect of printing inks, there are many differences in coating compositions, some physical and some chemical, and likewise there is a wide variety of systems for classifying coating compositions depending upon which similarities and differences it is desired to emphasize. Most coating compositions are liquids or pastes, that is, the vehicle before drying contains a liquid. There are a few exceptions such as powder coating compositions which are dry. The classification systems for coating compositions are generally similar to those for printing inks described above.

Electrically conductive coating compositions (i.e., coating compositions which upon application and drying produce an electrically conductive coating on the substrate) and electrically conductive printing ink compositions (in this context, printing ink compositions which upon application and drying produce electrically conductive ink on the substrate) are many and well known. The common characteristic of electrically conductive coatings and electrically conductive printing inks in their final forms on the substrate is that they are capable of conducting more than trivial amounts of electricity. The electrical resistance may be high or low, depending upon the many factors including the electrical properties of the coating or ink, and the dimensions of the applied material. For ordinary electrical conductors such as ordinarily used as flexible electrical conductors or on electronic circuit boards, low resistances are generally preferred. For resistors, higher resistances are usually desired. The resistance should not be so high, however, that for practical purposes it is not significantly conductive, as would be understood by those skilled in the art.

Whether before or after coating and/or printing, the microporous material may be bonded to a wide variety of porous or nonporous materials. The resulting laminate may be flexible or it may be substantially rigid, depending upon the nature of the material to which the microporous material is bonded.

Porous materials are those which are generally pervious to gases and which have a large number of pores, passageways, or channels through which matter can pass. These materials are those customarily recognized and employed for their porous properties. Examples of suitable materials include porous thermoplastic polymeric sheet or film, porous thermoset polymeric sheet or film, porous elastomeric sheet or film, and open celled foams. Other examples include fabrics, such as woven fabrics, knitted fabrics, nonwoven fabrics, and scrims. Still other examples include fiber mats, paper, synthetic paper, felt, and the like. Further examples of suitable porous materials include materials which are microporous such as the stretched microporous materials and precursor microporous materials described herein, as well as other materials which are microporous. In the porous materials which are based on fibers, the fibers may be natural, such as wood fibers, cotton fibers, wool fibers, silk fibers, and the like; or they may be any of the artificial fibers such as polyester fibers, polyamide fibers, acrylic fibers, modacrylic fibers, rayon fibers, and the like; or they may be combinations of differing kinds of fibers. The fibers may be staple and/or may be continuous. Metal fibers, carbon fibers, and glass fibers are within contemplation.

Substantially nonporous materials are those which are generally impervious to the passage of liquids, gases, and bacteria. On a macroscopic scale, substantially nonporous materials exhibit few if any pores, viz., minute openings through which matter passes. These materials include those customarily recognized and employed for their barrier properties. Examples of suitable materials include substantially nonporous thermoplastic polymeric sheet or film, substantially nonporous metalized thermoplastic polymeric sheet or film, substantially nonporous thermoset polymeric sheet or film, substantially nonporous elastomeric sheet or film, and substantially nonporous metal sheet or foil. Although the substantially nonporous material is most often in the form of sheet, film, or foil, other shapes may be used when desired, such as for example, plates, bars, rods, tubes, and forms of more complex shape. Examples of thermoplastic polymeric materials which are suitable for use include high density polyethylene, low density polyethylene, polypropylene, poly(vinyl chloride), saran, polystyrene, high impact polystyrene, the nylons, the polyesters such as poly(ethylene terephthalate), copolymers of ethylene and acrylic acid, and copolymers of ethylene and methacrylic acid. If desired, all or a portion of the carboxyl groups of carboxyl-containing copolymers may be neutralized with sodium, zinc, or the like. Examples of substantially nonporous thermoplastic sheets or films include extruded substantially nonporous thermoplastic sheet or film, coextruded substantially nonporous thermoplastic sheets or films of differing thermoplastic polymers, and substantially nonporous sheets or films coated with one or more differing thermoplastic polymers, and substantially nonporous thermoplastic sheets or films laminated to other thermoplastic sheets or films. An example of a metalized thermoplastic polymeric material is aluminized poly(ethylene terephthalate). Examples of thermoset polymeric materials include thermoset phenol-formaldehyde resin and thermoset melamine-formaldehyde resin. Examples of elastomeric materials include natural rubber, neoprene, styrene-butadiene rubber, acrylonitrile-butadiene-styrene rubber, elastomeric polyurethanes, and elastomeric copolymers of ethylene and propylene. Examples of metals include iron, steel, copper, brass, bronze, chromium, zinc, die metal, aluminum, nickel, and cadmium. Most often the metals employed are alloys.

Bonding may be made by conventional techniques such as for example fusion bonding and adhesive bonding. Examples of fusion bonding include sealing through use of heated rollers, heated bars, heated plates, heated bands, heated wires, flame bonding, radio frequency (RF) sealing, and ultrasonic sealing. Heat sealing is preferred. Solvent bonding may be used where the substrate material is soluble in the applied solvent at least to the extent that the surface becomes tacky. After the microporous material has been brought into contact with the tacky surface, the solvent is removed to form a fusion bond.

Many adhesives which are well known may be used to accomplish bonding. Examples of suitable classes of adhesives include thermosetting adhesives, thermoplastic adhesive, adhesives which form the bond by solvent evaporation, adhesives which form the bond by evaporation of liquid nonsolvent, and pressure sensitive adhesives.

Foamable compositions may be foamed in contact with the microporous material to form a bond between the resulting foam and the microporous material.

Powder bonding is a technique which is particularly useful for bonding the microporous material to nonwoven webs of staple and/or continuous fibers and to woven or knitted fibers.

The bond may be permanent or peelable, depending upon the bonding technique employed, the adhesive employed, and/or the nature of the substrate material to which the microporous material is bonded.

The microporous material may be essentially continuously bonded to the substrate material, or it may be discontinuously bonded to the substrate material. Examples of discontinuous bonds include bonding areas in the form of one or more spots, patches, strips, stripes, open-curved stripes, closed-curved stripes, irregular areas, and the like. When patterns of bonds are involved, they may be random, repetitive, or a combination of both.

The microporous material may be brought into contact with thermosettable molding composition and the resulting composite may then be molded under heat and pressure such that the composite is shaped and the molding composition cured to the thermoset state. Electrically conductive coating or electrically conductive printing ink may be applied to the microporous material before or after the composite is formed. The final electrically conductive article may be in a wide variety of shapes, such as substantially planar or three-dimensional.

The microporous material employed in the present invention is particularly useful for fusion bonding to thermoplastic organic polymeric substrates in the absence of extrinsic intervening adhesive. This technique is especially useful for producing many electrically conductive articles of the present invention, particularly printed circuit boards and electromagnetic interference shields. The method produces the best results when the thermoplastic organic polymer of the microporous material matrix is chemically similar to that of the substrate. This method is particularly useful when the thermoplastic organic polymer of the microporous material matrix and that of the substrate are polyolefinic in nature. The fusion bond obtained is ordinarily quite strong which is surprising inasmuch as the lamination of materials to polyolefins such as polyethylene and polypropylene is usually difficult unless special adhesives are used.

Fusion bonding is especially useful for the in-mold formation of electromagnetic interference shields and similar devices manufactured by the blow molding process. In this procedure, one or more sheets of microporous material (usually having an electrically conductive coating on one of its sides) are placed against the sides of the opened mold, the mold is closed, a polyolefin parison is blown to form the three-dimensional part, the mold is opened, and the part is ejected. If the microporous material of the part was not pre-coated, electrically conductive coating may be applied. A major advantage is that extrinsic intervening adhesive need not be employed.

Another type of fusion bonding process is useful for forming printed circuit boards. The printed circuit boards may be planar, but the process is particularly suitable for producing three-dimensional circuit boards. In this process microporous material having a pattern of electrically conductive printing ink on at least one side is molded with thermoplastic organic polymer to fusion bond the printed microporous material to the thermoplastic organic polymer and to form the three-dimensional printed circuit board. Extrinsic intervening adhesive need not be used.

The electrically conductive articles of the present invention have many and varied uses including substantially planar printed circuit hoards, three-dimensional printed circuit boards, electromagnetic interference shields, rigid conductors, flexible conductors, resistors for electronic circuits, and capacitors for electronic circuits.

The invention is further described in conjunction with the following examples which are to be considered illustrative rather than limiting.

Examples 1 and 2

The preparation of microporous material is illustrated by the following two descriptive examples. Processing oil was used as the processing plasticizer. Silica, polymer, lubricant, and antioxidant in the amounts specified in Table I were placed in a high intensity mixer and mixed at high speed for 6 minutes. The processing oil needed to formulate the batch was pumped into the mixer over a period of 12–18 minutes with high speed agitation. After completion of the processing oil addition a 6 minute high speed mix period was used to complete the distribution of the processing oil uniformly throughout the mixture.

TABLE I

| Example | Formulations | |
|---|---|---|
| | 1 | 2 |
| Ingredient | | |
| UHMWPE (1), kg | 19.50 | 7.08 |
| HDPE (2), kg | 7.71 | 0.00 |
| Precipitated Silica (3), kg | 40.82 | 40.37 |
| Lubricant (4), g | 2700.0 | 200.0 |
| Antioxidant (5) g | 0.0 | 200.0 |
| (6) g | 85.0 | 0.0 |
| Processing Oil (7), kg | | |
| in Batch | 61.1 | 61.1 |

TABLE I-continued

| | Formulations | |
|---|---|---|
| Example | 1 | 2 |
| at Extruder | ~59.3 | ~19.7 |

(1) UHMWPE = Ultrahigh Molecular Weight Polyethylene, Himont 1900, Himont, U.S.A., Inc.
(2) HDPE = High Density Polyethylene, Hostalen TM GM 6255, Hoechst Celanese Corp.
(3) HiSil ® SBG, PPG Industries, Inc.
(4) Petrac ® CZ81, Desoto, Inc., Chemical Speciality Division
(5) Irganox ® B-215, Ciba-Geigy Corp.
(6) Irganox ® 1010, Ciba-Geigy Corp.
(7) Shellflex ® 371, Shell Chemical Co.

The batch was then covered to a ribbon blender where usually it was mixed with up to two additional batches of the same composition. Material was fed from the ribbon blender to a twin screw extruder by a variable rate screw feeder. Additional processing oil was added via a metering pump into the feed throat of the extruder. The extruder mixed and melted the formulation and extruded it through a 76.2 centimeter x 0.3175 centimeter slot die. The extruded sheet was then calendered. A description of one type of calender that may be used may be found in the U.S. Pat. No. 4,734,229, the entire disclosure of which is incorporated herein by reference, including the structures of the devices and their modes of operation. Other calenders of different design may alternatively be used; such calenders and their modes of operation are well known in the art. The hot, calendered sheet was then passed around a chill roll to cool the sheet. The rough edges of the cooled calendered sheet were trimmed by rotary knives to the desired width.

The oil filled sheet was conveyed to the extractor unit where it was contacted by both liquid and vaporized 1,1,2-trichloroethylene (TCE). The sheet was transported over a series of rollers in a serpentine fashion to provide multiple, sequential vapor/liquid/vapor contacts. The extraction liquid in the sump was maintained at a temperature of 65°-88° C. Overflow from the sump of the TCE extractor was returned to a still which recovered the TCE and the processing oil for reuse in the process. The bulk of the TCE was extracted from the sheet by steam as the sheet was passed through a second extractor unit. A description of these types of extractors may be found in U.S. Pat. No. 4,648,417, the entire disclosure of which is incorporated herein by reference, including especially the structures of the devices and their modes of operation. The sheet was dried by radiant heat and convective air flow. The dried sheet was wound on cores to provide roll stock for further processing.

The microporous sheets were tested for various physical properties the results of which are shown in Table II. Breaking Factor and Elongation were determined in accordance with ASTM D 882-83 which is incorporated herein by reference.

Property values indicated by MD (machine direction) were obtained on samples whose major axis was oriented along the length of the sheet. TD (transverse direction; cross machine direction) properties were obtained from samples whose major axis was oriented across the sheet.

TABLE II

| Physical Properties of Microporous Sheet | | |
|---|---|---|
| Example No. | 1 | 2 |
| Thickness, mm | 0.203 | 0.224 |

TABLE II-continued

| Physical Properties of Microporous Sheet | | |
|---|---|---|
| Example No. | 1 | 2 |
| Weight, g/m$^2$ | 117.8 | 88.8 |
| Breaking Factor, kN/m | | |
| MD | 4.98 | 0.782 |
| TD | 1.34 | 0.364 |
| Elongation at break, % | | |
| MD | 632 | 215 |
| TD | 635 | 342 |
| Processing Oil Content, wt % | 3.6 | 2.9 |
| Estimated Porosity, vol % | 69.6 | |

EXAMPLE 3

Toilet seat lids were produced according to the following procedure. The bottom half of a toilet seat lid mold was lined with a sheet of microporous material similar to that of Example 1. A mixture of wood flour and phenolic resin was placed atop the microporous material and spread to distribute the mixture approximately uniformly across the mold. A second sheet of the microporous material was placed on the wood flour and phenolic resin mixture. The top half of the mold was mated with the lower half and heat and pressure were applied to cure the phenolic resin. The mold was opened and the molded part was removed and allowed to cool. The edges were sanded to remove flash from the lid. The lid was next coated with FFG G10945 Black Conductive Primer (PPG Industries, Inc.) using conventional flow coating techniques, baked at about 191° C. for about 11 minutes, and then allowed to cool. The lid was electrically grounded and electrostatically sprayed with PPG G12831 White Baking Enamel (PPG Industries, Inc.) using a Graco high speed bell electrostatic sprayer. After completion of the electrostatic spraying, the lid was baked at about 163° C. for about 8 minutes and allowed to cool. The appearance of the lid was excellent.

EXAMPLE 4

Thick film screen printing was used to print an electronic conductor on a sheet of the microporous material of Example 2. The printing was accomplished using a Porcelain Forslund Screen Printer, Model 35-00 (Crystal Mark, Inc.). The electrically conductive printing ink employed was Acheson Electrodag 423 ss carbon paste. The printed conductor was 23 millimeters long and 0.5 millimeter wide and was terminated at each end with enlarged terminals which were printed at the same time as the conductor. The resistance of the conductor was measured to be 9.3 kiloohms.

EXAMPLE 5

A sheet of the microporous material of Example 2 was laminated to a 97 percent alumina ceramic substrate using double-sided adhesive tape located between the microporous material and the ceramic substrate. Using the equipment and electrically conductive printing ink of Example 4, a pattern of fifteen substantially identical resistors was printed on the microporous material.

Although the present invention has been described with reference to specific details of certain embodiments thereof, it is not intended that such details should be regarded as limitations upon the scope of the inven-

We claim:

1. An electrically conductive article comprising:
   (a) at least one sheet of microporous material having generally opposing sides, said microporous material on a coating-free, printing ink-free, impregnant-free and pre-bonding basis comprising:
      (1) a matrix consisting essentially of substantially water insoluble thermoplastic organic polymer,
      (2) finely divided substantially water-insoluble filler particles, of which at least about 50 percent by weight are siliceous particles, said filler particles being distributed throughout said matrix and constituting from about 50 to about 90 percent by weight of said microporous material,
      (3) a network of interconnecting pores communicating substantially throughout said microporous material, said pores constituting at least about 35 percent by volume of said microporous material; and
   (b) electrically conductive coating or electrically conductive printing ink on at least a portion of at least one of said sides.

2. The electrically conductive article of claim 1 wherein electrically conductive coating or electrically conductive printing ink is on at least a portion of the other of said sides.

3. The electrically conductive article of claim 1 wherein said substantially water-insoluble thermoplastic organic polymer comprises essentially linear ultrahigh molecular weight polyolefin which is essentially linear ultrahigh molecular weight polyethylene having an intrinsic viscosity of at least about 18 deciliters/gram, essentially linear ultrahigh molecular weight polypropylene having an intrinsic viscosity of at least about 6 deciliters/gram, or a mixture thereof.

4. The electrically conductive article of claim 1 wherein said essentially linear ultrahigh molecular weight polyolefin is essentially linear ultrahigh molecular weight polyethylene having an intrinsic viscosity of at least about 18 deciliters/gram.

5. The electrically conductive article of claim 4 wherein said pores on a coating-free, printing ink-free, impregnant-free, and pre-bonding basis constitute at least about 60 percent by volume of said microporous material.

6. The electrically conductive article of claim 4 wherein said ultrahigh molecular weight polyethylene has an intrinsic viscosity in the range of from about 18 to about 39 deciliters/gram.

7. The electrically conductive article of claim 4 wherein said siliceous particles of said microporous material constitute from about 50 percent to about 85 percent by weight of said microporous material.

8. The electrically conductive article of claim 4 wherein said siliceous particles of said microporous material are silica.

9. The electrically conductive article of claim 4 wherein said siliceous particles of said microporous material are precipitated silica particles.

10. The electrically conductive article of claim 9 wherein said precipitated silica particles have an average ultimate particle size of less than about 0.1 micrometer.

11. The electrically conductive article of claim 4 wherein on a coating-free, printing ink-free, impregnant-free, and pre-bonding basis the volume average diameter of said pores as determined by mercury porosimetry is in the range of from about 0.02 to about 50 micrometers.

12. The electrically conductive article of claim 4 wherein on a coating-free, printing ink-free, impregnant-free, and pre-bonding basis the volume average diameter of said pores as determined by mercury porosimetry is in the range of from about 0.02 to about 0.5 micrometers.

13. The electrically conductive article of claim 4 wherein high density polyethylene is present in said matrix.

14. The electrically conductive article of claim 1 wherein said electrically conductive coating or said electrically conductive printing ink is on at least a portion of one of said sides and at least one of said sides is bonded to a substrate.

15. The electrically conductive article of claim 14 wherein said sides are substantially planar in form.

16. The electrically conductive article of claim 14 wherein said sides are three dimensional surfaces in form.

17. A printed circuit comprising:
   (a) at least one sheet of microporous material having generally opposing sides, said microporous material on a coating-free, printing ink-free, impregnant-free, and pre-bonding basis comprising:
      (1) a matrix consisting essentially of substantially water insoluble thermoplastic organic polymer,
      (2) finely divided substantially water-insoluble filler particles, of which at least about 50 percent by weight are siliceous particles, said filler particles being distributed throughout said matrix and constituting from about 50 to about 90 percent by weight of said microporous material,
      (3) a network of interconnecting pores communicating substantially throughout said microporous material, said pores constituting at least about 35 percent by volume of said microporous material; and
   (b) electrically conductive printing ink on at least a portion of at least one of said sides.

18. The printed circuit of claim 17 wherein additional electrically conductive printing ink is on at least a portion of the other of said sides.

19. The printed circuit of claim 17 wherein said substantially water-insoluble thermoplastic organic polymer comprises essentially linear ultrahigh molecular weight polyolefin which is essentially linear ultrahigh molecular weight polyethylene having an intrinsic viscosity of at least about 18 deciliters/gram, essentially linear ultrahigh molecular weight polypropylene having an intrinsic viscosity of at least about 6 deciliters/gram, or a mixture thereof.

20. The printed circuit of claim 17 wherein said essentially linear ultrahigh molecular weight polyolefin is essentially linear ultrahigh molecular weight polyethylene having an intrinsic viscosity of at least about 18 deciliters/gram.

21. The printed circuit of claim 20 wherein said pores on a coating-free, printing ink-free, impregnant-free, and pre-bonding basis constitute at least about 60 percent by volume of said microporous material.

22. The printed circuit of claim 20 wherein said ultrahigh molecular weight polyethylene has an intrinsic viscosity in the range of from about 18 to about 39 deciliters/gram.

23. The printed circuit of claim 20 wherein said siliceous particles of said microporous material constitute from about 50 percent to about 85 percent by weight of said microporous material.

24. The printed circuit of claim 20 wherein said siliceous particles of said microporous material are silica.

25. The printed circuit of claim 20 wherein said siliceous particles of said microporous material are precipitated silica particles.

26. The printed circuit of claim 25 wherein said precipitated silica particles have an average ultimate particle size of less than about 0.1 micrometer.

27. The printed circuit of claim 20 wherein on a coating-free, printing ink-free, impregnant-free, and pre-bonding basis the volume average diameter of said pores as determined by mercury porosimetry is in the range of from about 0.02 to about 50 micrometers.

28. The printed circuit of claim 20 wherein on a coating-free, printing ink-free, impregnant-free, and pre-bonding the volume average diameter of said pores as determined by mercury porosimetry is in the range of from about 0.02 to about 0.5 micrometers.

29. The printed circuit of claim 20 wherein high density polyethylene is present in said matrix.

30. The printed circuit of claim 20 which is flexible.

31. The printed circuit of claim 20 which is substantially rigid.

32. The printed circuit of claim 20 wherein said electrically conductive printing ink was applied to at least a portion of at least one of said sides by thick film screen printing.

33. The printed circuit of claim 20 wherein said electrically conductive printing ink is on at least a portion of one of said sides and at least one of said sides is bonded to a substrate.

34. The printed circuit of claim 33 wherein said other of said sides is fusion bonded to said substrate.

35. The printed circuit of claim 34 wherein said substrate comprises organic polymer in contact with said microporous material.

36. The printed circuit of claim 20 which is a substantially planar printed circuit board.

37. The printed circuit of claim 20 which is a three-dimensional printed circuit board.

38. A method for producing a three-dimensional printed circuit board comprising:
  (a) printing electrically conductive printing ink upon at least one side of a sheet of microporous material having generally opposing sides, said microporous material on a coating-free, printing ink-free, impregnant-free, and pre-bonding basis comprising:
   (1) a matrix consisting essentially of substantially water insoluble thermoplastic organic polymer,
   (2) finely divided substantially water-insoluble filler particles, of which at least about 50 percent by weight are siliceous particles, said filler particles being distributed throughout said matrix and constituting from about 50 to about 90 percent by weight of said microporous material,
   (3) a network of interconnecting pores communicating substantially throughout said microporous material, said pores constituting at least about 35 percent by volume of said microporous material;
  (b) molding the printed microporous material with organic polymer to bond said printed microporous material to said organic polymer and to form said three-dimensional printed circuit board.

39. The method of claim 38 wherein said substantially water-insoluble thermoplastic organic polymer comprises essentially linear ultrahigh molecular weight polyolefin which is essentially linear ultrahigh molecular weight polyethylene having an intrinsic viscosity of at least about 18 deciliters/gram, essentially linear ultrahigh molecular weight polypropylene having an intrinsic viscosity of at least about 6 deciliters/gram, or a mixture thereof.

40. The method of claim 38 wherein said essentially linear ultrahigh molecular weight polyolefin is essentially linear ultrahigh molecular weight polyethylene having an intrinsic viscosity of at least about 18 deciliters/gram.

41. The method of claim 40 wherein said siliceous particles of said microporous material are precipitated silica particles.

42. The method of claim 40 wherein high density polyethylene is present in said matrix.

* * * * *